United States Patent [19]

Pae et al.

[11] Patent Number: 5,060,196

[45] Date of Patent: Oct. 22, 1991

[54] CIRCUIT FOR ADJUSTING VOLTAGE LEVEL OF DATA OUTPUT IN A SEMICONDUCTOR MEMORY DEVICE

[75] Inventors: Myoung-Ho Pae; Dong-Su Jun, both of Suwon, Rep. of Korea

[73] Assignee: SamSung Electronics Co., Ltd., Kyung Ki-Do, Rep. of Korea

[21] Appl. No.: 471,933

[22] Filed: Jan. 29, 1990

[30] Foreign Application Priority Data

May 26, 1989 [KR] Rep. of Korea ............ 1989-7068[U]

[51] Int. Cl.⁵ ...................... G11C 7/00; G11C 11/413
[52] U.S. Cl. ............................... 365/189.05; 365/233; 365/193
[58] Field of Search ...................... 365/189.08, 189.05, 365/233.5, 226, 189.11, 233, 193; 307/475

[56] References Cited

U.S. PATENT DOCUMENTS

| | | | |
|---|---|---|---|
| 4,583,203 | 4/1986 | Monk | 365/189.11 X |
| 4,797,573 | 1/1989 | Ishimoto | 365/189.11 X |
| 4,817,055 | 3/1989 | Arakawa et al. | 365/226 X |
| 4,893,275 | 1/1990 | Tanaka et al. | 365/226 X |
| 4,894,803 | 1/1990 | Aizaki | 365/189.11 X |

Primary Examiner—Alyssa H. Bowler
Attorney, Agent, or Firm—Robert E. Bushnell

[57] ABSTRACT

The circuit for adjusting voltage level of data output in a semiconductor memory device, thereby having a high speed in its access time. The improvement comprises a power supply terminal; a ground reference voltage terminal; a data output terminal; a data output driving controller for receiving amplified sensing signals and outputting said signals in response to an enable clock; driving circuitry for outputting data output to the data output terminal in response to the signals outputted from the data output driving controller; control pulse generating circuitry receiving the enable clock, for generating an output data control pulse when the data output is completed by the enable clock; and high-impedance voltage generating circuitry for generating voltage level of high-impedance state in response to the output data control pulse and applying said high-impedance voltage to the data output terminal, whereby the voltage level of the data output terminal is controlled to return unconditionally to the high-impedance voltage level from preceding output voltage level.

6 Claims, 6 Drawing Sheets

CIRCUIT FOR ADJUSTING VOLTAGE LEVEL OF DATA OUTPUT IN A SEMICONDUCTOR MEMORY DEVICE

BACKGROUND OF THE INVENTION

The present invention generally relates to a circuit for adjusting voltage level of data output in a semiconductor memory device and, in particular, to a circuit for adjusting the voltage level of a data output terminal formed in a semiconductor memory device which produces the data in series, thereby having a high speed access time.

Generally, a dynamic random access memory (DRAM) includes a data output buffer at its data output terminal, for buffering the output signals of a sense amplifier and provides the buffered output signal to an output pad or to an output pin. In the data output buffer, differential amplifier output terminals SAS, $\overline{SAS}$ of the sense amplifier are initially set to a logic "high" and logic "low" levels, or in the alternative they are set to an intermediate level (i.e., a high impedance). In the meanwhile, if the output terminals SAS, $\overline{SAS}$ change their logic states to logic "low" or "high" because of data sensed (read) from a memory cell, then the data is buffered and coupled to the output terminals in responce to a data-output-enable clock.

FIG. 1 shows a known data output buffer. As shown in the drawing, the prior data output buffer includes two NMOS transistors M1, M2 which are coupled in series between a power supply terminal (Vcc PIN) 14 and a ground refererce terminal (Vss PIN) 16. A connection node 20 formed between the serial-connected NMOS transistors is connected to an output terminal ($D_{OUT}$ PIN) 18 by way of an inductor L2. Therefore, the data output buffer outputs data to the node 20 according to the logic data which is inputted to each gate of the transistors M1, M2. Further, there is provided a data output driving controller 12 for receiving the output data SAS, $\overline{SAS}$ of a differential sense amplifier (not shown) and for also receiving a data-output-enable clock $\phi$OE. These signals are applied to a data buffer in the data output driving controller 12. Then, the data output driving controller 12 applies the output data SAS, $\overline{SAS}$ of the differential amplifier to each gate of the NMOS transistors M1, M2, when enabled by the data-output-enable clock $\phi$OE.

In FIG. 1, inductors L1, L2, L3 are the inductance components formed by wire-bonding the chip substrate with each chip terminal. The inductors L1, L2, L3 are connected between the respective pin and the NMOS transistors M1, M2, in well-known manner. The current I1 will the conducted when the NMOS transistor M1 is turned on and, at the same time, the NMOS transistor M2 is turned off. Therefore the data output terminal 18 will be at a logic "high". On the contrary, the current I2 will be conducted when the NMOS transistors M1, M2 are respectively turned off and turned on, changing the output logic state of the data output terminal 18 to a logic "low".

Referring now to FIG. 2 which is a timing chart for showing the operation of the data output buffer of FIG. 1, this illustrates a general example of fast page mode of operation in a DRAM. That is, $\overline{RAS}$ represents a row address strobe; $\overline{CAS}$ represents a column address strobe; $\phi$OE represents a data-output-enable clock; CA represents a column address; A and B represent the data output at the output terminals A', B' of the data output driving controller 12; I1 and I2 represent the current flowing through the NMOS transistors M1 and M2, respectively; and $D_{OUT}$ represents the output data of the data output terminal 18.

Referring now to FIG. 3 which is another timing chart for showing the operation of the data output buffer circuit of FIG. 1, this illustrates a static column operating mode in a DRAM. The like notations in this drawing represent waveforms of the like data shown in FIG. 2.

First, the exemplary operation of the fast page mode in a DRAM having the known data output buffer of FIG. 1 will be explained hereinbelow, with reference to the waveforms of FIG. 2.

In the conventional DRAM, if the row address strobe $\overline{RAS}$ and column address strobe $\overline{CAS}$ are at the logic "low" state concurrently, row address and column address signals are sequentially sent to an addressed memory cell so as to read out the data stored therein. The data read out from the addressed memory cell is then amplified by means of the sense amplifier (not shown) and applied as the data signals SAS, $\overline{SAS}$ to the data output driving controller 12 of FIG. 1.

At about this moment, the data output enable clock $\phi$OE is inputted to the data output driving controller 12 with a given delay, according to the change of column address strobe $\overline{CAS}$ which now changes from a nonactive "low" state to an active "high" state.

The data output driving controller 12 receives the enable clock $\phi$OE and provides at its output terminals A', B' with the data SAS, $\overline{SAS}$ signals generated by the sense amplifier.

Assuming that the output data SAS, $\overline{SAS}$ of the sense amplifier correspond to a logic "1" which is read out of an addressed memory cell according to a first column address COL1, the data output driving controller 12 provides a logic "high" to the gate of the NMOS transistor M1 and a logic "low" to the gate of the NMOS transistor M2. Accordingly, the transistor M1 is turned on and the transistor M2 is turned off. So, the drain voltage of the transistor M1 will be applied to the node 20. The current I1 is conducted from the power supply terminal 14 through the inductor L1 and the NMOS transistor M1 to the output terminal 18 through the node 20.

Since the current I1 at the node 20 is conducted to the output terminal 18 through the inductor L2 which is wire-bonded between the node 20 and the output terminal 18, as shown in the drawing, the voltage at the output terminal 18 changes from the high-impedance voltage 2e as shown in FIG. 2 to the logic "high" voltage 2a. In this case, output noises are generated because of the inductor L1 of the power supply terminal 14 and the inductor L2 of the output terminal 18. Thus, for example, the initial portion of the output data having a logic "high" state will have a noise width according to the following equation (1).

$$NW_H = (L1 + L2) \left| \frac{dI1}{dt} \right| \quad (1)$$

After the logic data "1" has been read out of the memory cell designated by the first column address COL1 as mentioned above, the column address strobe $\overline{CAS}$ holds the logic "high" state for a given period of time and then returns to the logic "low" state after receiving the second column address COL2, as shown in FIG. 2.

Therefore, from the not illustrated memory cell corresponding to the second column address COL2 is read out the data stored thereinto and is applied as the data SAS, $\overline{SAS}$ to the data output driving controller 12 of FIG. 1, after amplified by means of the sense amplifier in the same manner as described before. At the same time, to the data output driving controller 12 is applied the enable clock $\phi OE$ which changes to logic "low" according to the column address strobe $\overline{CAS}$, as shown in FIG. 2. Further, if the logic state of the data outputted from the memory cell is logic "0", the data outputted from the data output driving controller 12 is the data A, B in FIG. 2. Thus, the NMOS transistor M1 is turned off while the NMOS transistor M2 is turned on. Accordingly, the current I2 as shown in FIG. 2 will flow from the output terminal 18 to the ground reference terminal 16 through the node 20. Since the current I2 flows by way of the inductor L3 coupled to the ground reference terminal 16 and the inductor L2 coupled to the output terminal 18, the data output at the output terminal 18 goes to the logic "low" state as shown in 2b of FIG. 2. In this case, the noise width of output data produced at the output terminal 18 will be determined by the inductors L2, L3 and is given in form of the following equation (2).

$$NW_L = (L2 + L3) \left| \frac{dI2}{dt} \right| \quad (2)$$

However, when a semiconductor memory device having the data output buffer as in FIG. 1 is operated in the fast page mode with an extremely short period, the following problems will arise.

Namely, in case the data of the preceding cycle had an extremely short precharging time, the voltage of the data output terminal 18 may not return to the high-impedance voltage level (2e of FIG. 2) for a sufficient length of time before the data of the current cycle is provided at the output. Therefore, if the data output of the preceding cycle and the data output of the current cycle are opposite in their phase or voltage level, the data output speed will be relatively lowered because of the wide swing in voltage at the data output terminal 18. In addition, the noise width of the data output from the output terminal 18 will become wider because of the inductors L1, L2, and L3 (See 2d of FIG. 2).

Next, an exemplary operation of the static column mode in a semiconductor memory device having the data output buffer as shown in FIG. 1 will be described hereinbelow, with reference to FIG. 3.

As shown in FIG. 3, when the row address strobe $\overline{RAS}$ goes to the active "low" state, a semiconductor memory device operating in the static column mode is addressed by the row address ROW as in usual operation. With the sequential receiving of the first and second column address signals COL1, COL2 as illustrated in FIG. 3 and, at the same time, the transition of the column address strobe $\overline{CAS}$ to the active "low" state, the data stored in a memory cell (not shown) which is addressed by the row address and column address signals caused by the row address strobe $\overline{RAS}$ will be accessed (read out).

Thereafter, the data read out from the memory cell by the above address designation is amplified by means of the sense amplifier in such a manner as described above. The output data SAS, $\overline{SAS}$ are applied to the data output driving controller 12 in FIG. 1. At about the same time, the enable clock $\phi OE$ generated from the column address strobe $\overline{CAS}$ is applied to the data output driving controller 12 after delaying a given period of time. The data output driving controller 12 receives the enable clock $\phi OE$ and provides at its output terminals A', B' the data SAS, $\overline{SAS}$.

If the data accessed (read out) from a memory, cell by the first column address COL1 of FIG. 1 is a logic "1" and the data accessed by the second column address COL2 is logic "0" which is opposite to the preceding logic state, then the data output driving controller 12 outputs the data A, B of FIG. 3 to the output terminals A', B' thereof. Therefore, the output data of the output terminal 18 is initially set to the high-impedance voltage as illustrated at 3c of FIG. 3. The logic "1" illustrated at 3a or logic "0" illustrated at 3b of FIG. 3 is buffered to the output terminal 18.

However, when a semiconductor memory device having the data output buffer of FIG. 1 is operated in the static column mode, the following problems will arise.

When the phase of the preceding data output is opposite that of the current data output, the precharging time required for the data output to return to the voltage level of the high-impedance state is usually not assigned. Therefore, the voltage level of the data output terminal 18 will swing more widely. As a result, the data access speed (output speed) is reduced, compared with the case when the data is generated under the condition that the output terminal 18 is always at the high-impedance voltage (3c of FIG. 3).

Further, both the current I1 flowing from the power supply terminal 14 to the output terminal 18 and the current I2 flowing from the output terminal 18 to the ground reference terminal 16 will be substantially increased, causing the noise width to increase.

SUMMARY OF THE INVENTION

Accordingly, it is an object of the present invention to provide a circuit for adjusting voltage level of output data to a high-impedance voltage level within a substantially extremely short period of time, i.e., only while a data output buffer is disabled, in a semiconductor memory device having a data output buffer.

The inventive circuit for carrying out the above object includes a power supply terminal; a ground reference terminal; a data output terminal; a data output driving controller for receiving data having logic "high" or "low" state and for outputting said data inputted thereto by being enabled according to a data output enable clock; driving means having two NMOS transistors connected in series between the power supply terminal and the ground reference terminal, for driving the voltage of gating signals while the gating signals are inputted to the data output driving controller, said driven voltage being outputted to the data output terminal through a connection node formed between the two NMOS transistors; a control pulse generating means for receiving said data output buffer enable clock and generating an output data control pulse at the time that the data is completely outputted in response to the enable clock; and a high-impedance voltage generating means connected between a given power supply voltage and ground reference voltage supplied respectively from the power supply terminal and ground reference terminal, for generating voltage of the high-impedance according to the output data control pulse generated from the control pulse generating means, and applying the high-impedance voltage to the output terminal which is, at the same time, the connection node of the NMOS transistors of the driving means.

BRIEF DESCRIPTION OF THE DRAWINGS

For a better understanding of the invention and to show how the same may be carried into effect, reference will now be made, by way of example, to the accompanying diagrammatic drawings, in which.

DETAILED DESCRIPTION OF THE PREFERRED EMBODIMENTS

An embodiment of the invention will now be described hereinbelow, with reference to the accompanying drawings, by only way of example.

Figure 4:
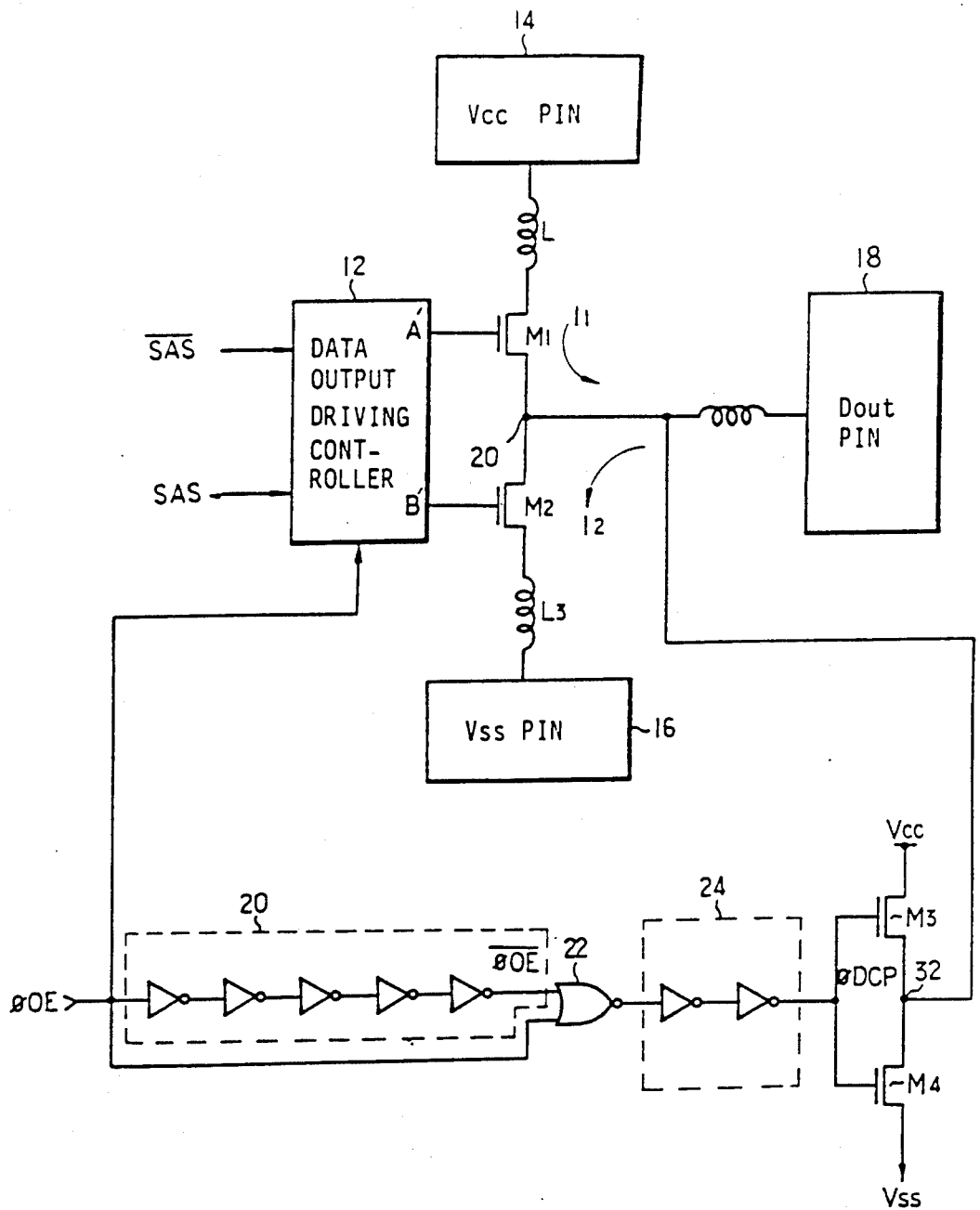
FIG. 4 shows a circuit for adjusting the voltage level of the data out a terminal in a semiconductor memory device according preferred embodiment of the present invention.

Referring to FIG. 4, there is shown a circuit for adjusting the voltage level of the data output terminal according to the preferred embodiment of the invention. The circuit is provided with an inverse delay buffer 20 not only for inverting the enable clock $\phi$OE but also for delaying the enable clock.

The output of the inverse delay buffer 20 and the enable clock $\phi$OE are coupled to a NOR gate 22. The NOR gate 22 provides an the output data control pulse $\phi$DCP to a buffer 24 for buffering the output of the NOR gate 22. The data control pulse $\phi$DCP output of the buffer 24 is then applied to a high-impedance voltage generating circuit which is comprised of two NMOS transistors M3, M4 connected in series between power supply voltage Vcc and ground reference voltage Vss, for outputting the high-impedance voltage to the node 20 through a node 32.

Figure 1:
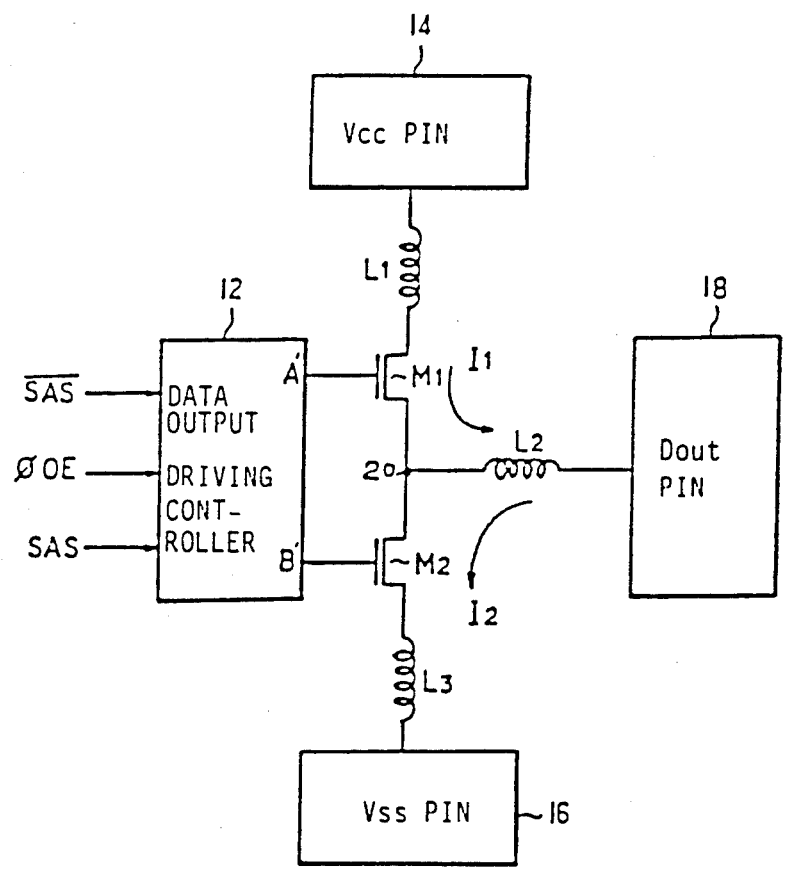
FIG. 1 shows a diagram of a data output buffer for use in a prior semiconductor memory device.

According to the embodiment, the enable clock $\phi$OE is commonly applied to the inverse delay buffer 20 and to the enable clock terminal of the data output driving controller 12 of FIG. 1. The node 32 of the high-impedance voltage generating means is connected to the node 20 of the driving means.

In FIG. 4, the high-impedance voltage generating means includes two NMOS transistors M3, M4 connected in series between the power supply voltage Vcc and the ground reference voltage Vss in which the connection point is the node 32, each gate of the transistors M3, M4 receiving the output data control pulse $\phi$DCP of the buffer 24.

Figure 5:
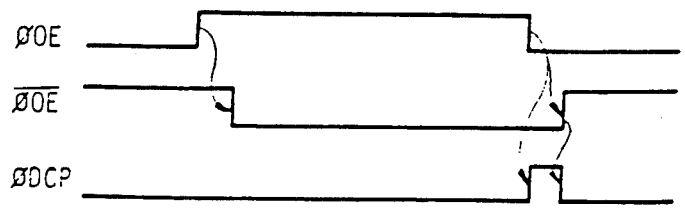
FIG. 5 s the operational waveforms of some parts of the embodiment shown in FIG. 4.

FIG. 5 shows an operational waveform of given parts of the embodiment, wherein the $\phi$OE signal represents the enable clock, $\phi$OE represents the inverted enable clock, and DCP represents the output data control pulse from the NOR gate 22.

Figure 6:
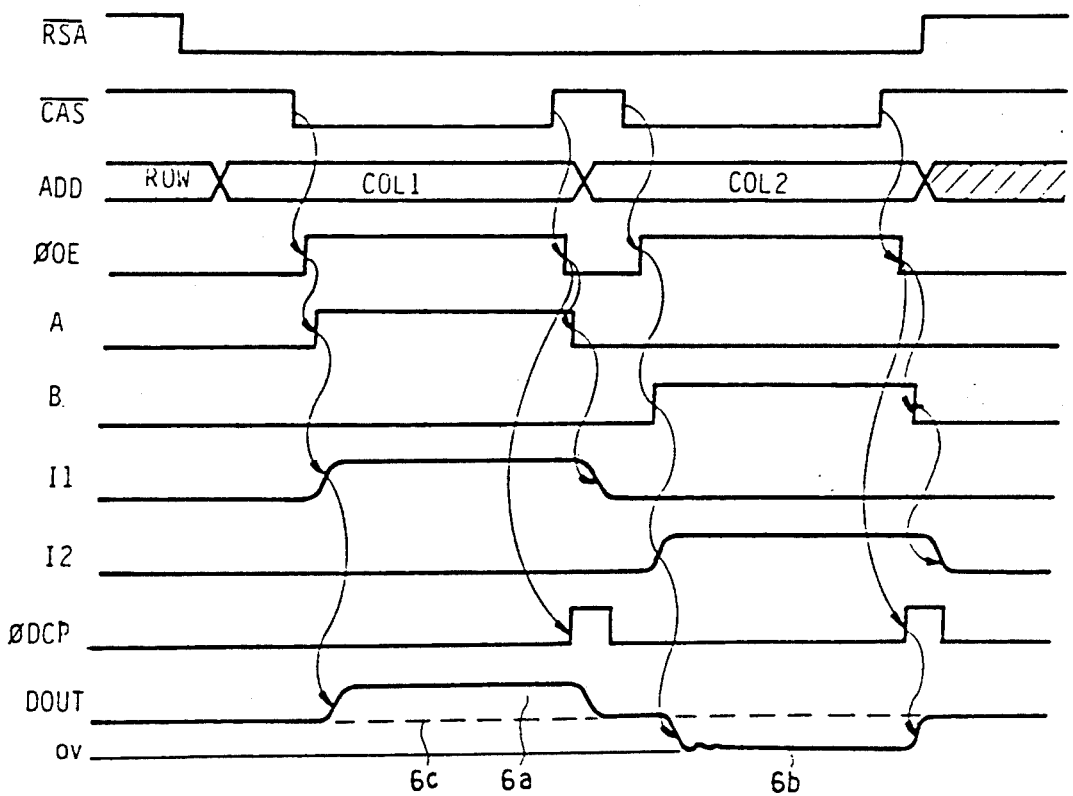
FIG. 6 shows an operational timing chart of the embodiment shown in FIG. 4.

Referring to FIG. 6, it is a diagram of the operational waveforms of the data output buffer shown in FIG. 4 according to the invention, said data output buffer currently being operated in the fast page mode. In the drawing, $\overline{RAS}$ represents the row address strobe; $\overline{CAS}$ the column address strobe; ADD the address; OE the enable clock; A and B the output of the data output driving controller 12; I1 and I2, the active current of the NMOS transistors M1, M2; $\phi$DCP the control pulse for the output data; and DOUT the output data of the data output terminal 18.

Figure 7:
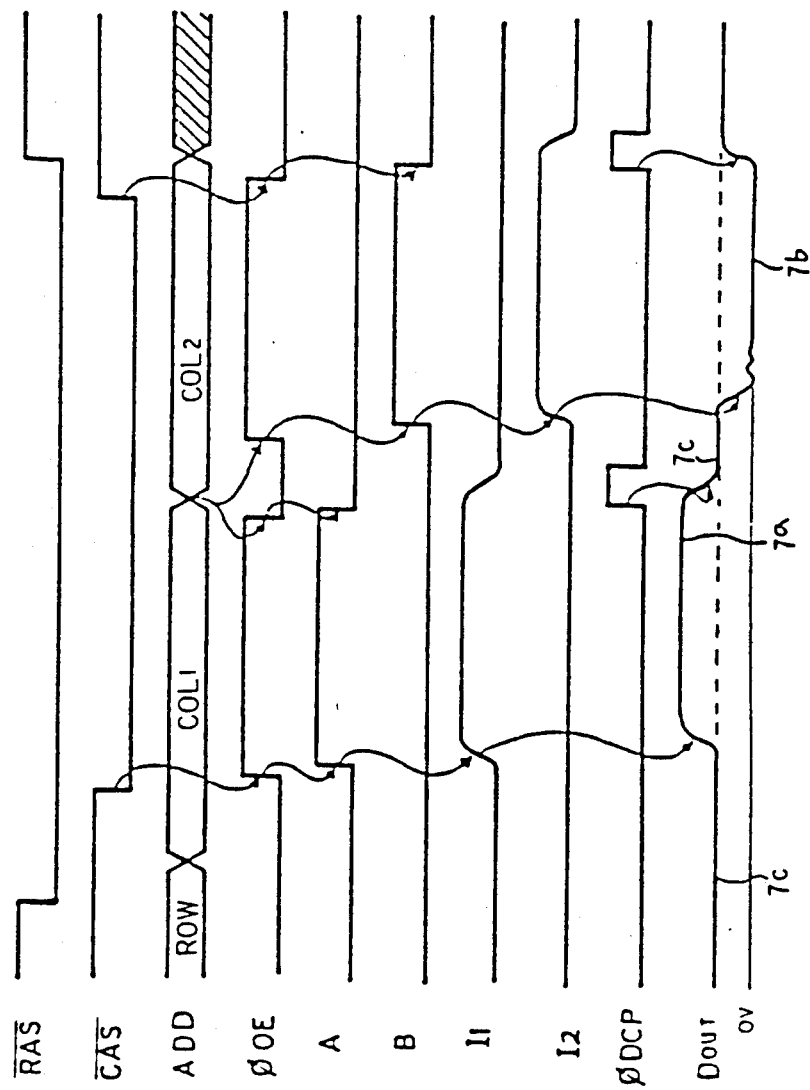
FIG. 7 another operational timing chart of the embodiment of FIG. 4.

FIG. 7 shows the waveforms of the data output buffer of FIG. 4, when it is operated in the static column mode. All reference numerals herein represents the like data or waveforms shown in FIG. 6.

An exemplary operation of the invention will now be given more specifically hereinbelow, with reference to FIGS. 4-7.

First, regarding an exemplary operation of a semiconductor memory device having the data output buffer of FIG. 4, the memory device being operated under the fast page mode, the features and improvement of the invention will be apparent from reading the explanation taken in connection with the accompanying drawings.

Figure 2:
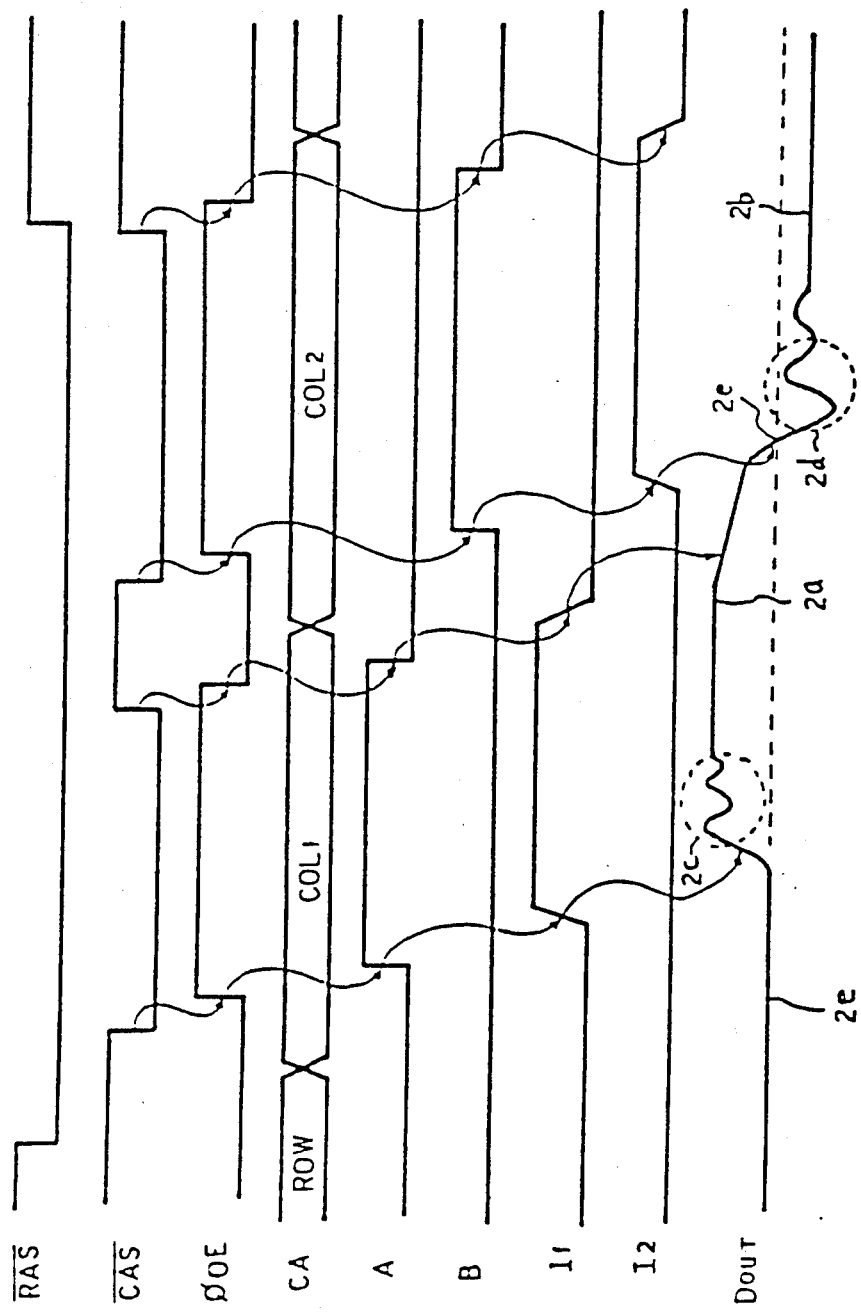
FIG. 2 shows an operational timing chart of the conventional data output buffer of FIG. 1.
Figure 3:
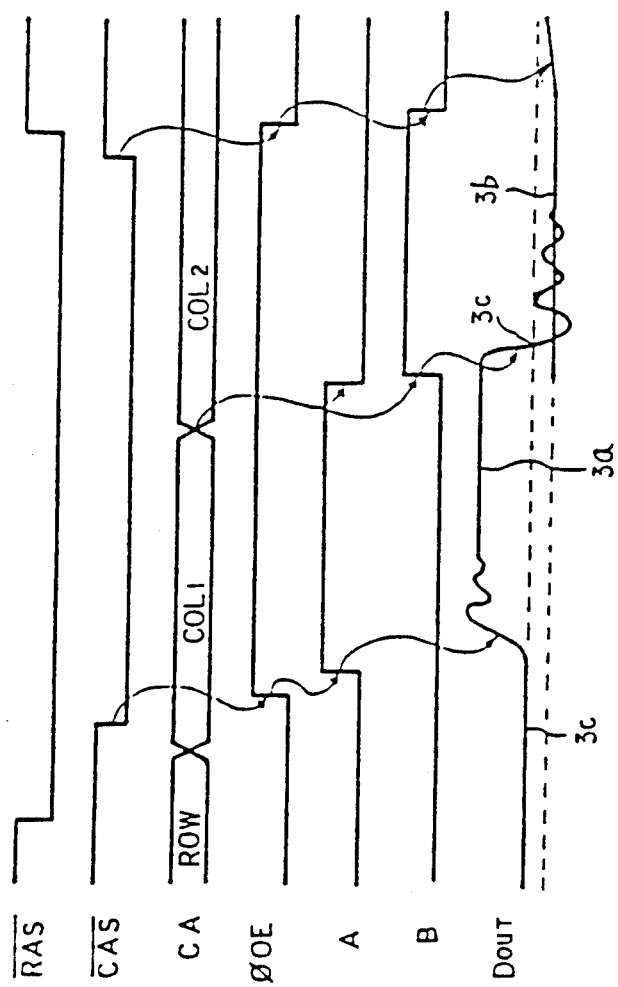
FIG. 3 shows another operational timing chart of the conventional data output buffer of FIG. 1.

If the address ADD, row address strobe $\overline{RAS}$ and column address strobe $\overline{CAS}$ of FIG. 6 are applied to the semiconductor memory device of FIG. 4, data stored in a memory cell which is arranged at a given row and column is read out, in the same manner as described in FIG. 2. The data read out from the memory cell is amplified by the sense amplifier and applied to the data output driving controller 12.

In this case, the enable clock $\phi$OE is applied with a predetermined time delay to the data output driving controller 12, As shown in FIG. 6, the enable clock $\phi$OE follows with the predetermined delay the column address strobe $\overline{CAS}$. At the same time, the enable clock $\phi$OE is also applied to the inverse delay buffer 20 and NOR gate 22. If the data read out from the memory cell according to the first column address COL1 of the address ADD shown in FIG. 6 is logic "1", then only the terminal A' of the data output driving controller 12 goes to the logic "high" stat, as illustrated in FIG. 6.

Thus, only the NMOS transistor M1 is turned on, resulting in the current I1 flowing through the node 20. Therefore, the output terminal 18 having previously been a high-impedance voltage (See 6c of FIG. 6) makes a transition to the logic "high" state 6a of FIG. 6.

In the mean time, if the pre-charging cycle starts by the column address strobe $\overline{CAS}$ going to logic "high" state, then the enable clock $\phi$OE goes to the logic "low" state, as shown in FIG. 6. As a result, the data output driving controller 12 is disabled, and the output terminal A' will goes to the logic "low" state.

At about the same moment, the NOR gate 22 receives the enable clock $\phi$OE with an input terminal thereof and the inverted enable clock $\phi$OE with another input terminal thereof, Thus, NOR gate 22 provides the data control pulse $\phi$DCP having the logic "high" state as illustrated in FIG. 6. The output data control pulse $\phi$DCP is buffered by the buffer 24 and then applied to the gates of the NMOS transistors M3, M4.

Whilst the output data pulse $\phi$DCP is at the logic "high" state, the NMOS transistors M3, M4 are both turned on. As a result, current will flow from the power supply voltage Vcc to the ground reference voltage Vss through the transistors M3, M4. Therefore, the voltage level of the output terminal 18 goes to almost to the high-impedance voltage level based upon the turn-on resistance ratio determined by the NMOS transistors M3, M4.

Therefore, the voltage level of the output terminal 18 is at the usual high-impedance voltage level before the column address strobe $\overline{CAS}$ proceeds to the succeeding active logic state, even if the pre-charging time of the column address strobe $\overline{CAS}$ is extremely short. In the case where the output is produced while the active cycle is at the logic "0" state, the swing width of the output voltage is decreased remarkably. Therefore the data access speed will become very high and the noise generated to the output will be suppressed.

Another exemplary operation of the static column mode taken in connection with FIG. 7 will now be described. When the row address strobe $\overline{RAS}$ goes to the active logic "low" state, the semiconductor memory device operating in the static column mode strobes, in the usual manner, the row address ROW, as illustrated in FIG. 7. If then the first and second column address COL1, COL2 are sequentially applied to the memory device and column address strobe $\overline{CAS}$ goes to the active logic "low" state, the data stored in a memory cell will be accessed by the column address and row address, which are responsive to the row address strobe $\overline{RAS}$.

Thereafter, the data read out from the memory cell is amplified by the sense amplifier, in the same manner as given in FIG. 1. The outputs SAS, $\overline{SAS}$ of the sense amplifier are applied to the data output driving controller 12 of FIG. 4. Then, the enable clock $\phi$OE responsive to the column address strobe $\overline{CAS}$ is applied to the data output driving controller 12 with a given time delay.

The data output driving controller 12 receiving the enable clock $\phi$OE generates the output SAS, $\overline{SAS}$ of the sense amplifier to the output terminals A', B' in response to the enable clock $\phi$OE. Therefore, the data read out from the memory cell by addressing of the first column address COLI is applied to the gates of the NMOS transistors M1, M2 in response to the enable clock $\phi$OE, and at the same time, the output state $D_{OUT}$ will change its logic state from the high-impedance of 7c to the logic "high" state of 7a, as illustrated in FIG. 7.

Meanwhile, the enable clock $\phi$OE generated according to the column address strobe $\overline{CAS}$ having the active logic "low" state is applied both to the inverse delay buffer 20 and to the NOR gate 22. If the first column address COL1 is replaced by the second column address COL2 while the data read out by the first column address COL1 is outputted the enable clock $\phi$OE goes to the logic "low" state. Then at the same moment, the NOR gate 22 produces the output data control pulse $\phi$DCP (FIG. 7), in the same manner as the fast page mode described above.

In addition, the enable clock $\phi$OE may be easily changed to the logic "low" state for a given period of tire by means of the column address transition detection ATD (not shown), in response to the change of the column address. Therefore, in the static column mode having no pre-charging time for the column address strobe $\overline{CAS}$, the output data control pulse DCP is generated by the NOR gate 22 each time the column address is changed, the control pulse $\phi$DCP being applied to the gates of the NMOS transistors M3, M4 through the buffer 24.

While the output data control pulse $\phi$DCP is in the logic "high" state, a current path is formed between the power supply voltage Vcc and ground reference voltage Vss due to the NMOS transistors M3, M4 being both turned on concurrently. So, the voltage level of the output terminal 18 will be at the high-impedance voltage level determined by the turn-on resistance ratio of the NMOS transistors M3, M4, as shown in 7c of FIG. 7.

It will therefore be well understood that since the output voltage level $D_{OUT}$ always starts to change its logic states at the high-impedance voltage level in the event that the data read out by a next column address is outputted to the output terminal 18, the voltage swing width is narrowed and the data will be generated in high speed with less noise, even if the phase of the data currently at the output without pre-charging time is opposite to that of the preceding data.

As described above, the improvement generates the output data control pulse by making use of a data output enable clock. The voltage level of the output terminal of the semiconductor memory device is controlled to return to the high-impedance voltage level within a given short time from the voltage level of the preceding data. Therefore, the invention provides the advantages of decreasing the output noises and increasing the data output speed very high.

Although specific constructions and procedures of the invention have been illustrated and described herein in connection with a preferred embodiment, it is not intended that the invention be limited to the elements and constructions disclosed. One skilled in the art will easily recognize that the particular elements or subconstructions may be used without departing from the scope and spirit of the invention.

What is claimed is:

1. A circuit for adjusting voltage level of a data output terminal in a semiconductor memory device, comprising:
    a power supply terminal;
    a ground reference voltage terminal;
    a data output terminal;
    a data output driving controller for receiving amplified sensing signals at input terminals thereof and for outputting said amplified sensing signals in response to an enable clock, said data output driving controller being enabled by said enable clock;
    driving means for outputting data to the data output terminal in response to reception of the amplified sensing signals outputted from the data output driving controller;
    control pulse generating means receiving said enable clock, for generating an output data control pulse at a point that the data output driving controller has completed the outputting of the amplified sensing signal as enabled by the enable clock; and
    high-impedance voltage generating means connected between the output terminal, the power supply terminal and the ground reference voltage terminal, for generating a high-impedance voltage in response to the output data control pulse and applying said high-impedance voltage to the output terminal, whereby the voltage level of the data output terminal is controlled to return unconditionally to the high-impedance voltage elvel from an output voltage level said output terminal obtains during data output.

2. The circuit of claim 1, wherein the control pulse generating means comprises:
an inverse delay buffer for inverting said enable clock and delaying the enable clock for a given period of time;
means for performing logic NOR operation by receiving the enable clock with one input thereof and the inverted enable clock with another input thereof, and generating the output data control pulse which holds a given logic state for a given period of time; and
means for buffering the output data control pulse and applying the control pulse, as the high-impedance voltage level control signal, to the high-impedance voltage generating means.

3. The circuit of claim 2, wherein said enable clock for data output buffer is transited to an active logic state for a given period of time in response to change of column address, thereby disabling the data output driving controller.

4. The circuit of claim 1 or 2, wherein the high-impedance voltage generating means comprises two n-channel metal-oxide semiconductor transistors connected in series, whose connection point is coupled to the data output terminal, said transistors being connected between the power supply voltage and ground reference voltage, whereby the high-impedance voltage generating means is operated in such a manner that said transistors are turned on simultaneously by the output data control signal generated from the control pulse generating means and thereby a current path is formed between the power supply terminal and ground reference voltage terminal and thereby providing the high-impedance voltage level to the data output terminal, said high-impedance voltage level being determined by turn-on resistance ratio of the two n-channel metal-oxide-semiconductor transistors.

5. The circuit of claim 1, wherein said driving means includes two n-channel metal-oxide-semiconductor transistors connected in series between the power supply terminal and the ground reference voltage terminal.

6. A circuit for adjusting voltage level of a data output terminal in a semiconductor memory device, comprising:
a power supply terminal;
a ground reference voltage terminal;
a data output terminal;
a data output driving controller having a plurality of input terminals, for receiving amplified sensing signals at said input terminals and for providing said amplified sensing signals in response to an enable clock, said data output driving controller being enabled by said enable clock;
driving means for providing data to the data output terminal in response to reception of the amplified sensing signals from the data output driving controller;
control pulse generating means receiving said enable clock, for generating an output data control pulse at a point that the data output driving controller has the amplified sensing signals as enabled by the enable clock; and
high-impedance voltage generating means connected between the data output terminal, the power supply terminal and the ground reference voltage terminal, for generating a high-impedance voltage in response to the output data control pulse and applying said high-impedance voltage to the data output terminal.

* * * * *

UNITED STATES PATENT AND TRADEMARK OFFICE
CERTIFICATE OF CORRECTION

PATENT NO. : 5,060,196

DATED : October 22, 1991

INVENTOR(S) : Myoung-Ho Bae, et al

It is certified that error appears in the above-identified patent and that said Letters Patent is hereby corrected as shown below:

Col. 1, line 53, change "the" (first occurrence) to --be--.

Col. 5, line 20, change "out a" to --output--.
      line 21, insert --to the-- after "according".
      line 23, change "s" to --shows--.

Col. 7, line 60, change "tire" to --time--.

Col. 8, line 66, change "elvel" to --level--.

Signed and Sealed this

Eighteenth Day of May, 1993

Attest:

MICHAEL K. KIRK

Attesting Officer     Acting Commissioner of Patents and Trademarks